(12) United States Patent
Chu (10) Patent No.: US 12,471,340 B2
(45) Date of Patent: Nov. 11, 2025

(54) MANUFACTURING METHOD OF FORMING SEMICONDUCTOR DEVICE AND SEMICONDUCTOR DEVICE

(71) Applicant: Panjit International Inc., Kaohsiung (TW)

(72) Inventor: Hung Shen Chu, Zhubei (TW)

(73) Assignee: Panjit International Inc., Kaohsiung (TW)

( * ) Notice: Subject to any disclaimer, the term of this patent is extended or adjusted under 35 U.S.C. 154(b) by 506 days.

(21) Appl. No.: 18/050,181

(22) Filed: Oct. 27, 2022

(65) Prior Publication Data

US 2024/0145551 A1 May 2, 2024

(51) Int. Cl.
| | | |
|---|---|---|
| H10D 30/01 | (2025.01) | |
| H01L 21/265 | (2006.01) | |
| H10D 30/47 | (2025.01) | |
| H10D 62/824 | (2025.01) | |
| H10D 62/85 | (2025.01) | |

(52) U.S. Cl.
CPC ... *H10D 62/8503* (2025.01); *H01L 21/26546* (2013.01); *H10D 30/015* (2025.01); *H10D 30/475* (2025.01); *H10D 62/824* (2025.01)

(58) Field of Classification Search
CPC .................................................. H10D 30/015
See application file for complete search history.

(56) References Cited

U.S. PATENT DOCUMENTS

| | | | | |
|---|---|---|---|---|
| 2006/0219997 A1* | 10/2006 | Kawasaki | ............. | H10D 62/82 257/E29.05 |
| 2006/0220042 A1* | 10/2006 | Yaegashi | ............. | H10D 10/021 257/E21.387 |
| 2006/0220060 A1* | 10/2006 | Nakata | ................ | H10D 64/411 257/E29.127 |
| 2009/0267078 A1* | 10/2009 | Mishra | ............... | H01L 29/2003 257/E21.403 |
| 2013/0168739 A1* | 7/2013 | Kiyama | ................ | H10D 30/47 257/194 |
| 2013/0221434 A1* | 8/2013 | Okada | ................. | H10D 64/117 438/270 |
| 2013/0234156 A1* | 9/2013 | Okada | ................. | H10D 30/015 438/270 |
| 2013/0248876 A1* | 9/2013 | Yaegashi | ............. | H10D 62/117 438/268 |
| 2013/0316507 A1* | 11/2013 | Saitoh | ............... | H10D 62/8503 438/285 |
| 2014/0004668 A1* | 1/2014 | Saitoh | .............. | H01L 21/02458 438/172 |
| 2019/0081167 A1* | 3/2019 | Chen | ................. | H10D 30/4732 |

\* cited by examiner

*Primary Examiner* — Grant S Withers (74) *Attorney, Agent, or Firm* — Wang Law Firm, Inc.

(57) ABSTRACT

A method of forming a semiconductor device and the structure of the semiconductor device are provided. The manufacturing method includes the following steps of: providing a native substrate; sequentially forming a first nucleation layer, a thick GaN substrate layer, a second nucleation layer, an AlGaN barrier layer, a GaN channel layer and a leakage current stop layer; forming an aperture area through the leakage current stop layer; forming a GaN buffer layer; implanting Mg ions to the GaN buffer layer to form a current blocking layer; forming a GaN drift layer; forming a metallic interlayer on the GaN drift layer and transferring the GaN drift layer on a transferred substrate through the metallic interlayer; removing a semiconductor stack; forming a source contact, a gate contact and a drain contact.

11 Claims, 11 Drawing Sheets

MANUFACTURING METHOD OF FORMING SEMICONDUCTOR DEVICE AND SEMICONDUCTOR DEVICE

BACKGROUND OF THE INVENTION

1. Field of the Invention

The present invention generally relates to a manufacturing method of forming a semiconductor device and the structure of the semiconductor device, and in particular, to the semiconductor device containing the thick GaN substrate and the current blocking layer made by ions implantation and the manufacturing method of forming the semiconductor device.

2. Description of the Related Art

The high power semiconductor device has the growing demand and the III-V gallium nitride power device is the frequently used material for forming semiconductor device operated in high speed, high power and high temperature. The gallium nitride (GaN) material may have an energy band gap of about 3.4 eV. The semiconductor device contains the gallium nitride material can be used in the power converters, power suppliers. These are widely used in the vehicles, the electrical motors, or other power device.

The semiconductor device may contain different band gap material, for example, the aluminum gallium nitride (AlGaN). The heterostructure may generate the channel of the semiconductor device and to form a current aperture vertical electron transistor. The current aperture vertical electron transistor has the advantages on high speed. However, the leakage current may occur like the gate parasitic leakage current. Even if the current blocking layer is formed, the pits and roughen surface caused by the regrowth of the GaN may generate high current leakage through the current blocking layer. The leakage current problem may reduce the reliability of the semiconductor device.

In summary, the conventional manufacturing method for forming the semiconductor device still has considerable problems. Hence, the present disclosure provides the method of forming the semiconductor device and the structure of the semiconductor device to resolve the shortcomings of conventional technology and promote industrial practicability.

SUMMARY OF THE INVENTION

In view of the aforementioned technical problems, the primary objective of the present disclosure is to provide a manufacturing method of forming a semiconductor device and the structure of the semiconductor device, which are capable of preventing the leakage current of semiconductor device and reducing the manufacturing cost of the semiconductor device.

In accordance with one objective of the present disclosure, a manufacturing method of forming a semiconductor device is provided. The manufacturing method includes the following steps of: providing a native substrate, the native substrate having a lattice mismatch with GaN less than 3.6%; sequentially forming a first nucleation layer, a thick GaN substrate layer, a second nucleation layer, an AlGaN barrier layer, a GaN channel layer and a leakage current stop layer on the native substrate, the first nucleation layer, the thick GaN substrate layer, the second nucleation layer, the GaN channel layer and the leakage current stop layer are un-doped; forming an aperture area through the leakage current stop layer; forming a GaN buffer layer on the leakage current stop layer and the aperture area; implanting Mg ions to the GaN buffer layer to form a current blocking layer on the leakage current stop layer; forming a GaN drift layer on the current blocking layer and the GaN buffer layer; forming a metallic interlayer on the GaN drift layer and transferring the GaN drift layer on a transferred substrate through the metallic interlayer; removing a semiconductor stack, the semiconductor stack includes the second nucleation layer, the thick GaN substrate layer, the first nucleation layer and the native substrate; forming a source contact through the AlGaN barrier layer, the source contact contacting the GaN channel layer; forming a gate contact on the AlGaN barrier layer; forming a drain contact on the transferred substrate.

Preferably, the native substrate may include GaN, AlN or SiC.

Preferably, the first nucleation layer may include an AlN layer or an AlN/AlGaN superlattice layer.

Preferably, the AlN/AlGaN superlattice layer may be composed of $Al_{(x)}Ga_{(1-x)}N$ and mole fraction x of the $Al_{(x)}Ga_{(1-x)}N$ is above 0.6.

Preferably, the thick GaN substrate layer may have a thickness and the thickness is above 1 µm.

Preferably, the second nucleation layer may include an AlN layer or an AlN/AlGaN superlattice layer.

Preferably, the AlN/AlGaN superlattice layer may be composed of $Al_{(y)}Ga_{(1-y)}N$ and mole fraction y of the $A_{(y)}Ga_{(1-y)}N$ is above 0.6.

Preferably, the leakage current stop layer may include AlN or $Ga_2O_3$.

Preferably, the current blocking layer may be formed by selective Mg ion implantation.

Preferably, the semiconductor stack may be removed by mechanical thinning, chemical etching, photoelectrochemical etching or laser lift-off.

Preferably, the transferred substrate may include Si, GaAs, $Al_2O_3$ or $Ga_2O_3$.

In accordance with one objective of the present disclosure, a semiconductor device is provided. The semiconductor device includes a transferred substrate, a metallic interlayer, a GaN drift layer, a current blocking layer, a GaN buffer layer, a leakage current stop layer, a GaN channel layer and an AlGaN barrier layer. The transferred substrate has a drain contact formed on a rear surface of the transferred substrate. The metallic interlayer is disposed on the transferred substrate. The GaN drift layer is disposed on the metallic interlayer. The current blocking layer is disposed on the GaN drift layer and the current blocking layer is formed by Mg ion implantation to a GaN layer. The GaN buffer layer is disposed on an aperture area of the GaN layer. The leakage current stop layer is disposed on the current blocking layer. The GaN channel layer is disposed on the GaN buffer layer and the leakage current stop layer. The AlGaN barrier layer is disposed on the GaN channel layer. The AlGaN barrier layer has a source contact and a gate contact. The source contact is disposed through the AlGaN barrier layer for contacting the GaN channel layer and the gate contact is disposed on a top surface of the AlGaN barrier layer.

Preferably, the transferred substrate may include Si, GaAs, $Al_2O_3$ or $Ga_2O_3$.

Preferably, the leakage current stop layer may include AlN or $Ga_2O_3$.

Preferably, the current blocking layer may be formed by selective Mg ion implantation.

Preferably, the GaN channel layer, the leakage current stop layer and the GaN buffer layer may be un-doped.

As mentioned previously, the method of forming the semiconductor device and the structure of the semiconductor device in accordance with the present disclosure may have one or more advantages as follows.

1. The method of forming the semiconductor device and the structure of the semiconductor device are capable of preventing the leakage current by leakage current stop layer and current blocking layer. The root causes of the parasitic leakage currents can be deleted by the fabrication method disclosed in the present disclosure, so as to form the semiconductor device with excellent device performance and reliability.
2. The method of forming the semiconductor device and the structure of the semiconductor device may recycle the native substrate when the semiconductor stack is removed. The substrate can be reused at different process to reduce the manufacturing cost.
3. The method of forming the semiconductor device and the structure of the semiconductor device may form the two dimensional electron gas mobile carrier by the heterostructure, so as to form the semiconductor device with high speed and excellent thermal stability.

BRIEF DESCRIPTION OF THE DRAWINGS

The technical features, detail structures, advantages and effects of the present disclosure will be described in more details hereinafter with reference to the accompanying drawings that show various embodiments of the invention as follows.

DETAILED DESCRIPTION OF THE PREFERRED EMBODIMENTS

In order to facilitate the understanding of the technical features, the contents and the advantages of the present disclosure, and the effectiveness thereof that can be achieved, the present disclosure will be illustrated in detail below through embodiments with reference to the accompanying drawings. The diagrams used herein are merely intended to be schematic and auxiliary to the specification, but are not necessary to be true scale and precise to the configuration after implementing the present disclosure. Thus, it should not be interpreted in accordance with the scale and the configuration of the accompanying drawings to limit the scope of the present disclosure on the practical implementation.

As those skilled in the art would realize, the described embodiments may be modified in various different ways. The exemplary embodiments of the present disclosure are for explanation and understanding only. The drawings and description are to be regarded as illustrative in nature and not restrictive. Similar reference numerals designate similar elements throughout the specification.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

Figure 1A:
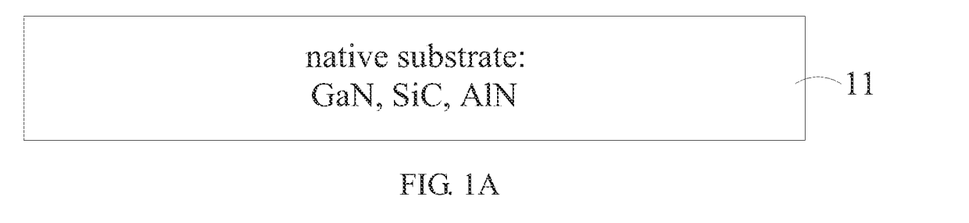
FIG. 1A to FIG. 1J are schematic diagrams of the manufacturing process of forming the semiconductor device in accordance with the embodiment of the present disclosure.
Figure 1B:
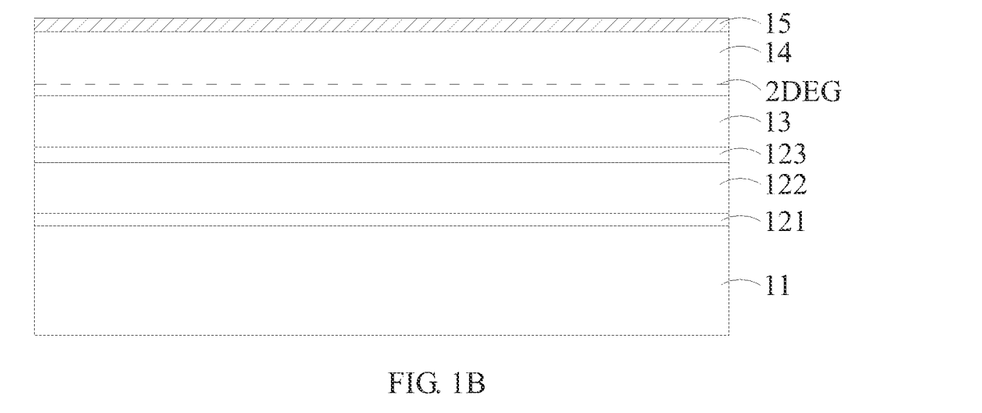
Figure 1C:
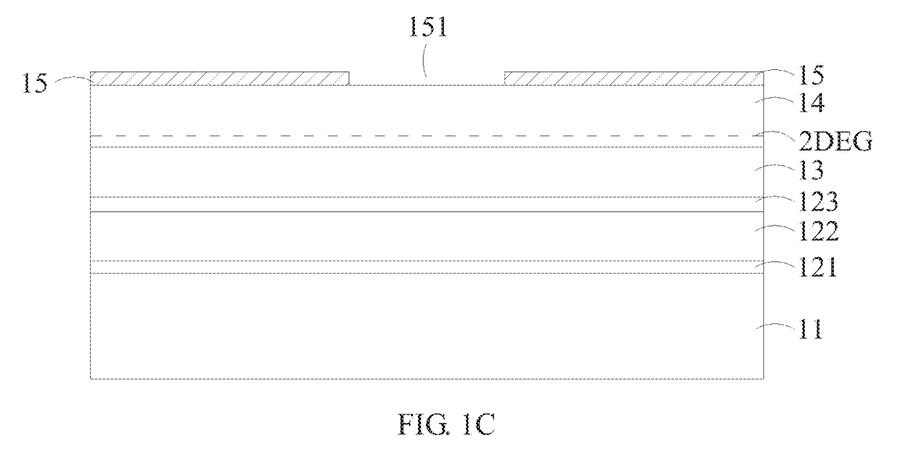
Figure 1D:
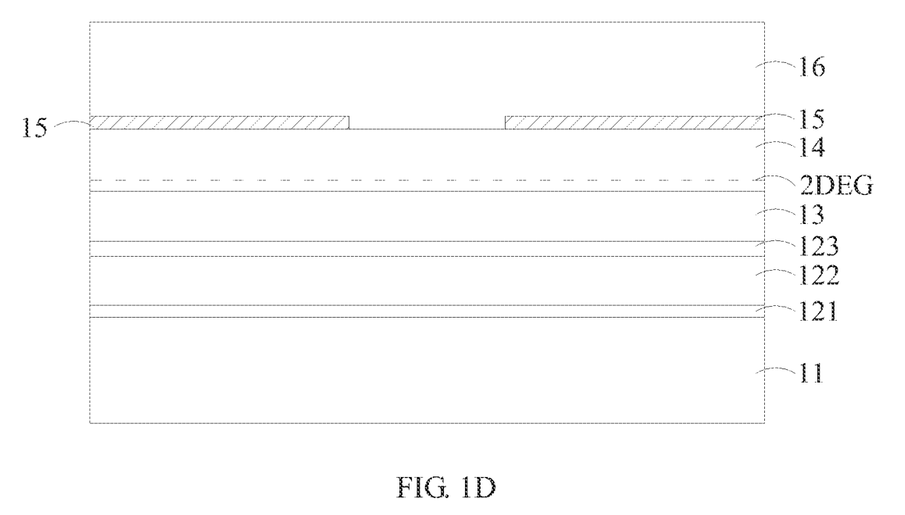
Figure 1E:
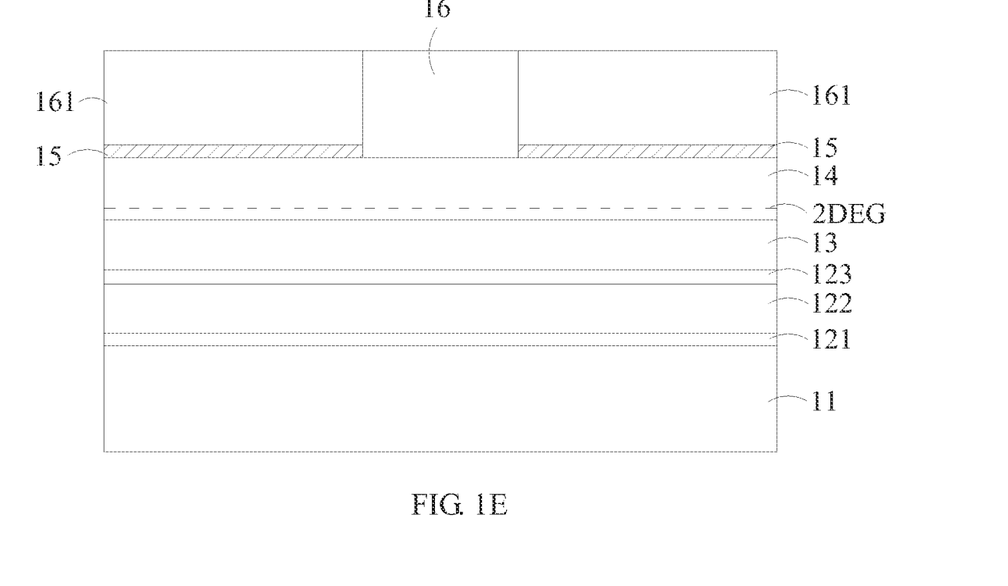
Figure 1F:
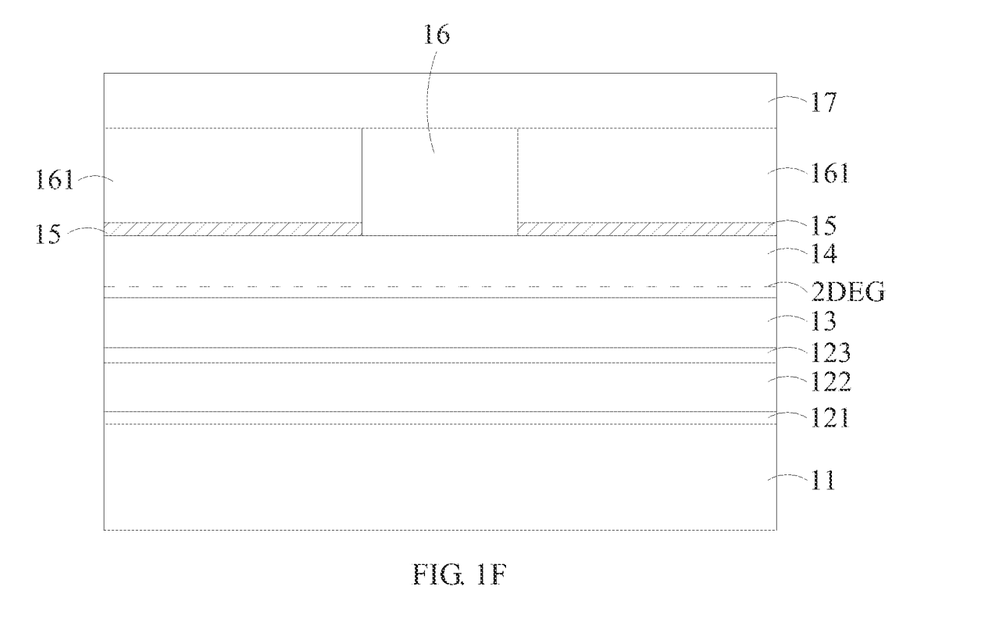
Figure 1G:
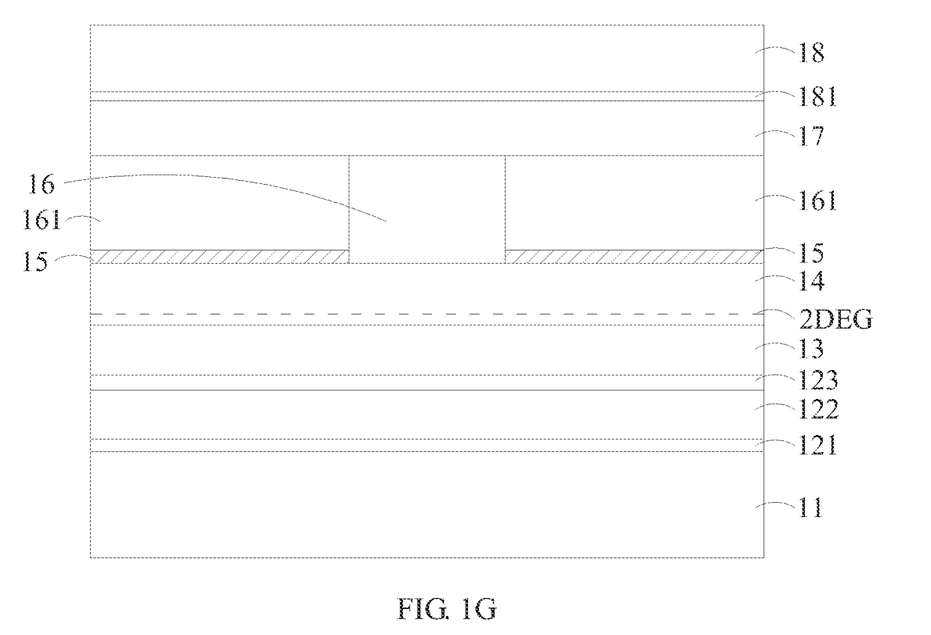
Figure 1H:
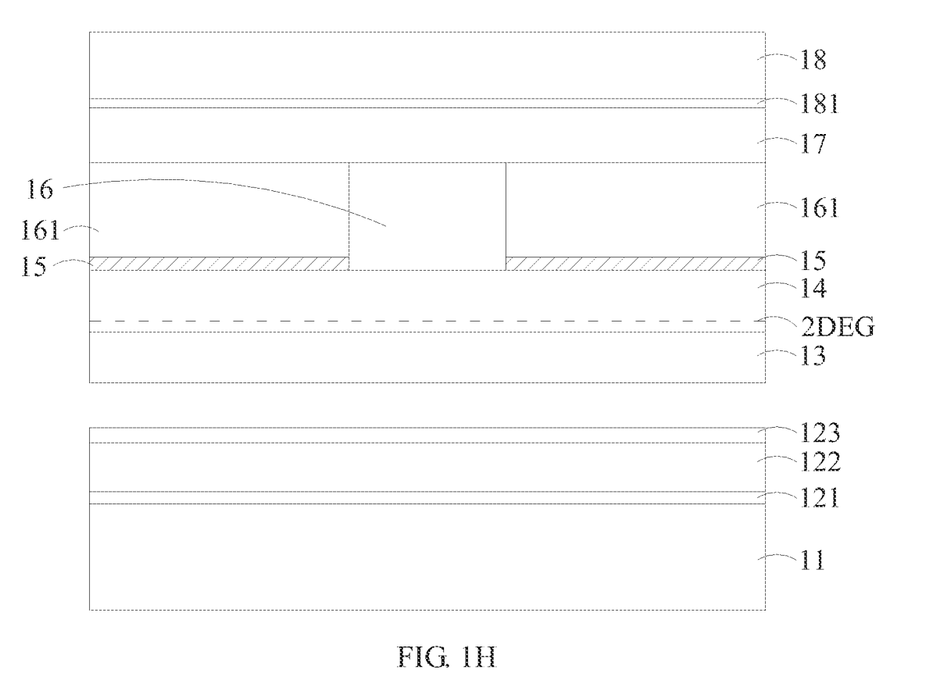
Figure 1I:
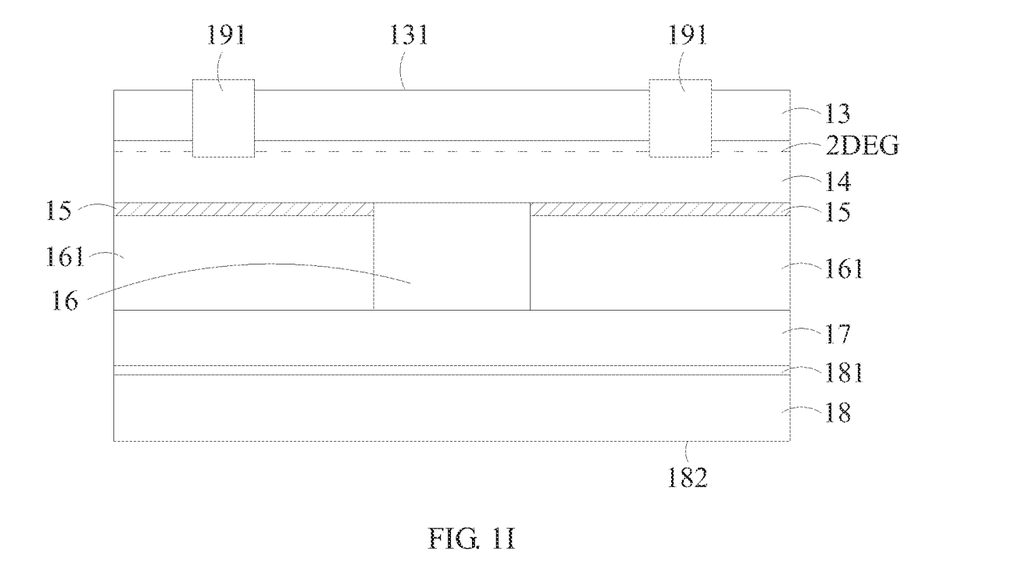
Figure 1J:
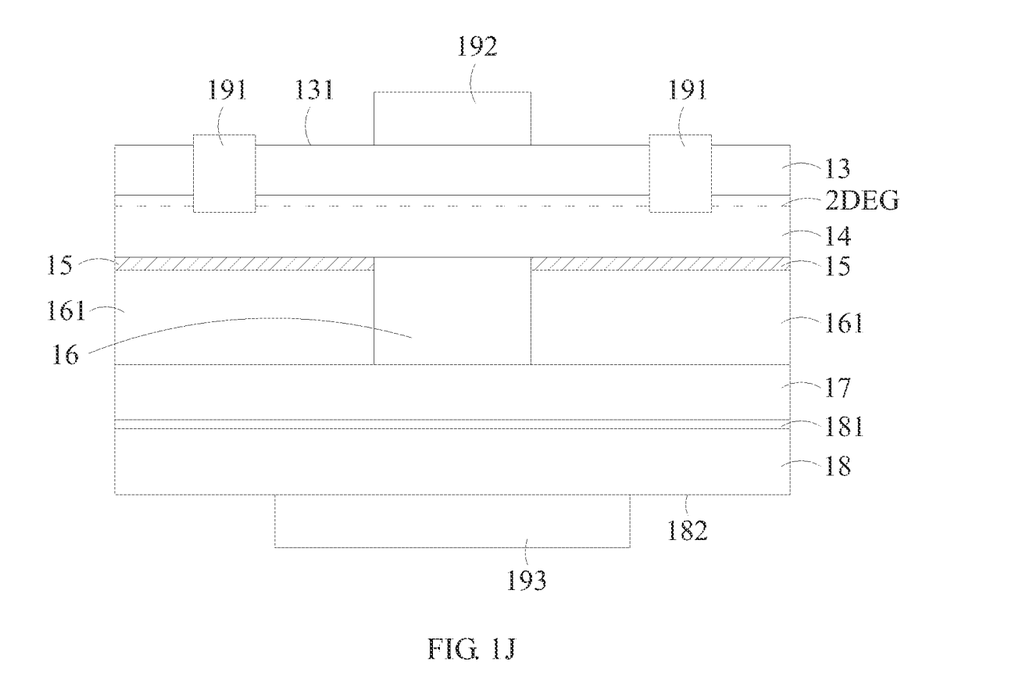

Please refer to FIG. 1A and FIG. 1J, which are schematic diagrams of the manufacturing process of forming the semiconductor device in accordance with the embodiment of the present disclosure.

In FIG. 1A, the manufacturing process provides a native substrate 11, the native substrate 11 having a lattice mismatch with GaN less than 3.6%. The manufacturing process provides a native substrate 11 and the native substrate 11 may be the substrate for disposing the semiconductor layers formed by the following steps. The native substrate 11 does not limited by the specific material. For example, the native substrate 11 may include GaN, AlN or SiC.

In FIG. 1B, the manufacturing process sequentially forms a first nucleation layer 121, a thick GaN substrate layer 122, a second nucleation layer 123, an AlGaN barrier layer 13, a GaN channel layer 14 and a leakage current stop layer 15 on the native substrate 11. The first nucleation layer 121, the thick GaN substrate layer 122, the second nucleation layer 123, the GaN channel layer 14 and the leakage current stop layer 15 are un-doped. The semiconductor device does not need to consider the doping concentration problem in the manufacturing processes. Continued from the previous step, the several semiconductor layers are sequentially formed on the native substrate 11. Since the native substrate 11 may be low lattice mismatched substrate, the present step forms the thick GaN substrate layer 122 to enhance the reliability of the later active GaN based epitaxial growth.

Firstly, the first nucleation layer 121 is formed on the native substrate 11. The first nucleation layer 121 may be an AlN layer or an AlN/AlGaN superlattice layer. If the first nucleation layer 121 is the AlN/AlGaN superlattice layer, the AlN/AlGaN superlattice layer is composed of $Al_{(x)}Ga_{(1-x)}N$ and the mole fraction x of the $Al_{(x)}Ga_{(1-x)}N$ is above 0.6. For example, x may be 0.7 or 0.8. Then the thick GaN substrate layer 122 is formed on the first nucleation layer 121. The thick GaN substrate layer 122 may have a thickness and the thickness is above 1 μm. The thick GaN substrate layer 122 should be thick enough to ensure that the lattice is neatly arranged and the surface of the thick GaN substrate layer 122 is the almost defect-free surface.

The second nucleation layer 123 is formed on the thick GaN substrate layer 122. Similar to the first nucleation layer 121, the second nucleation layer 123 may be an AlN layer or an AlN/AlGaN superlattice layer. If the second nucleation layer 123 is the AlN/AlGaN superlattice layer, the AlN/AlGaN superlattice layer is composed of $Al_{(y)}Ga_{(1-y)}N$ and the mole fraction y of the $Al_{(y)}Ga_{(1-y)}N$ is above 0.6. For example, y may be 0.7 or 0.8. Based on the thick GaN substrate layer 122 and the second nucleation layer 123, the lattice is neatly arranged. The active region formed on the above stacked layer may be the low defect active region.

After forming the low defect layer, the AlGaN barrier layer 13 and the GaN channel layer 14 are sequentially formed on the second nucleation layer 123. The AlGaN barrier layer 13 is disposed on the second nucleation layer 123 and the GaN channel layer 14 is disposed on the AlGaN barrier layer 13. The AlGaN barrier layer 13 and the GaN channel layer 14 may be the active region. The two dimensional electron gas 2DEG is occurred at the GaN channel layer 14 and the carrier transport of the two dimensional electron gas 2DEG may generate a current flow for the semiconductor device.

When the semiconductor device drives to generate the current flow, some current leakage paths may be generated from source to drain. In order to prevent the current leakage, the blocking layer is used to block the leakage path. However, the conventional epi-growth method is not easy to form the block layer at predetermined area. The lattice stacked at the location of current flow may also be influenced. Therefore, the present disclosure forming the leakage current stop layer 15 on the GaN channel layer 14. The leakage current stop layer 15 may include AlN or $Ga_2O_3$. The leakage current stop layer 15 is the ultra-wide bandgap interlayer, for example, the AlN is 6.2 eV. The leakage current stop layer 15 is grown on the entire area of the channel structure, that is, the GaN channel layer 14. Compared to partial growth process, the present manufacture process may have higher process reliability and better product quality.

In FIG. 1C, the manufacturing process forms an aperture area 151 through the leakage current stop layer 15. The leakage current stop layer 15 is etched by a hard mask to form the aperture area 151. The aperture area 151 is corresponding to the gate area. The etching process may expose the top surface of the GaN channel layer 14.

In FIG. 1D, the manufacturing process forms a GaN buffer layer 16 on the leakage current stop layer 15 and the aperture area 151. The GaN layer buffer layer 16 is growing from the GaN channel layer 14 and to fill up the aperture area 151. The GaN layer buffer layer 16 is further growing form the surface of the leakage current stop layer 15 and the aperture area 151.

In FIG. 1E, the manufacturing process implants Mg ions to the GaN buffer layer 16 to form a current blocking layer 161 on the leakage current stop layer 15. The Mg ion implantation can be conducted on the GaN buffer layer 16. For example, the selective Mg ion implantation. Using the implantation process instead of the GaN buffer regrowth layer process may form the planar surface. The gate current leakage caused by the non-planar surface can be avoided.

In FIG. 1F, the manufacturing process forms a GaN drift layer 17 on the current blocking layer 161 and the GaN buffer layer 16. In the previous process, the Mg ions are implanted in the GaN buffer layer 16. The surface of the GaN buffer layer 16 and the surface of the current blocking layer 161 are flat. The GaN buffer layer 16 is formed on the planar surface and the quality of the GaN growth will be better. The GaN growing process may be the metal organic chemical vapor phase deposition (MOCVD) process.

In FIG. 1G, the manufacturing process forms a metallic interlayer 181 on the GaN drift layer 17 and transferring the GaN drift layer 17 on a transferred substrate 18 through the metallic interlayer 181. In order to transfer the semiconductor device formed by the previous processes, the metallic interlayer 181 is formed on the GaN drift layer 17. At the same time, the transferred substrate 18 also has a metallic interlayer 181 disposed on the surface of the transferred substrate 18. The transferred substrate 18 may include Si, GaAs, $Al_2O_3$ or $Ga_2O_3$. The above material for forming the transferred substrate 18 is not easy to combine with the GaN drift layer 17. Therefore, the metallic interlayer 181 is used as the buffer layer for combining the transferred substrate 18 and the GaN drift layer 17.

In FIG. 1H, the manufacturing process removes a semiconductor stack, the semiconductor stack includes the second nucleation layer 123, the thick GaN substrate layer 122, the first nucleation layer 121 and the native substrate 11. Since the transferred substrate 18 is disposed on the GaN drift layer 17, the transferred substrate 18 is regarded as the main substrate of the semiconductor device. In the present step, the semiconductor stacked is removed to expose the AlGaN barrier layer 13. The semiconductor stack may be removed by mechanical thinning, chemical etching, photoelectrochemical etching or laser lift-off.

The semiconductor stack includes the second nucleation layer 123, the thick GaN substrate layer 122, the first nucleation layer 121 and the native substrate 11. Since the semiconductor stack is removed, the thick GaN substrate layer 122 and the native substrate 11 can be recycled and used at different manufacturing processes. The manufacturing cost can be reduced by saving the substrate material. In addition, the material of the transferred substrate 18 can be selected according to needs. The process flexibility can be increased.

In FIG. 1I, the manufacturing process forms source contacts 191 through the AlGaN barrier layer 13, the source contacts 191 contact the GaN channel layer 14. In the previous process, the semiconductor stack is removed. The remained semiconductor device can be flipped over. That is, the transferred substrate 18 is on the bottom and the AlGaN barrier layer 13 is on the top. The transferred substrate 18 has a rear surface 182 and the AlGaN barrier layer 13 has a tops surface 131. The AlGaN barrier layer 13 can be etched from the tops surface 131 to form the voids. The source contacts 191 are formed by filling up the voids with the conductive material, for example, the material can be copper. The source contacts 191 may pass through the AlGaN barrier layer 13 and contact the GaN channel layer 14. In some embodiments, the source contacts 191 may pass through the GaN channel layer 14 with predetermined depth.

In FIG. 1J, the manufacturing process forms a gate contact 192 on the AlGaN barrier layer 13 and forms drain contact 193 on the transferred substrate 18. After forming the source contacts 191, the gate contact 192 is formed on the top surface 131 of the AlGaN barrier layer 13 and the drain contact 193 is formed on the rear surface 182 of the transferred substrate 18. In the present embodiment, the drawing only shows the single gate contact structure and single drain contact structure. However, the present disclosure is not limited to the single contact structure. In other embodiment, the gate contact 192 and the drain contact 193 can be plural. The gate contact 192 is disposed at the location corresponding to the aperture area 151, that is, the GaN buffer layer 161. The drain contact 193 may be overlapped to the leakage current stop layer 15 and the current blocking layer 161. Based on the leakage current stop layer 15 and the current blocking layer 161, the current leakage path from the source contacts 191 to the drain contact 193 can be blocked. The parasitic leakage current penetrating the current blocking layer 161 can be avoided, so as to form the high speed power current aperture vertical electron transistor (CAVET) with excellent reliability.

Figure 2:
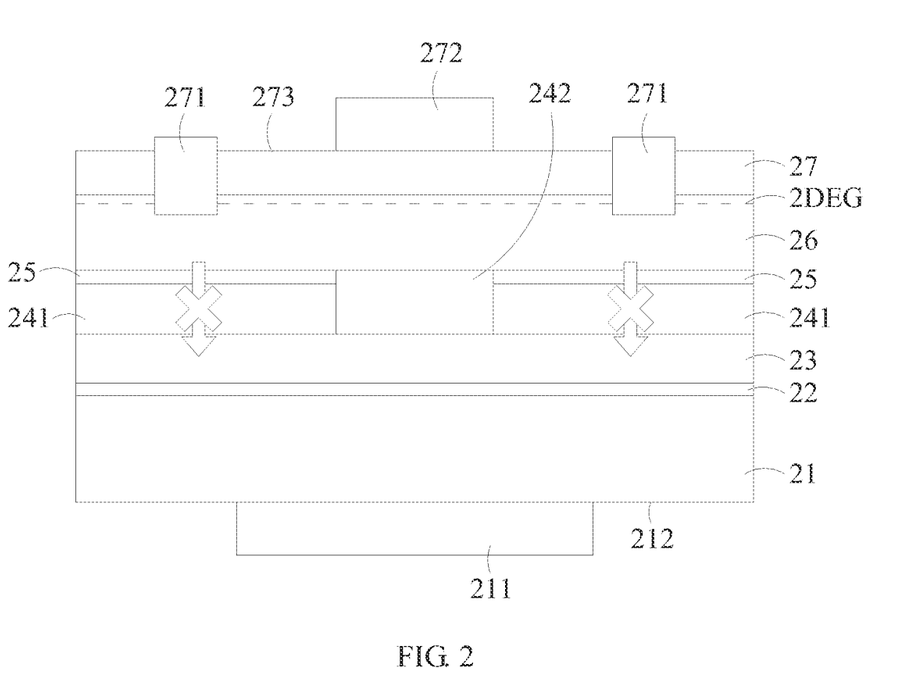
FIG. 2 is schematic diagram of the semiconductor device in accordance with the embodiment of the present disclosure.

Please refer to FIG. 2, which is the schematic diagram of the semiconductor device in accordance with the embodiment of the present disclosure.

As shown in FIG. 2, the semiconductor device 20 includes a transferred substrate 21, a metallic interlayer 22, a GaN drift layer 23, a current blocking layer 241, a GaN buffer layer 242, a leakage current stop layer 25, a GaN channel layer 26 and an AlGaN barrier layer 27. The transferred substrate 21 has a drain contact 211 formed on a rear surface 212 of the transferred substrate 21. The AlGaN barrier layer 27 has source contacts 271 and gate contact 272. The source contacts 271 are disposed through the AlGaN barrier layer 27 for contacting the GaN channel layer 26 and the gate contact 272 is disposed on a top surface 273 of the AlGaN barrier layer 27.

The transferred substrate 21 may include Si, GaAs, $Al_2O_3$ or $Ga_2O_3$. The metallic interlayer 22 is disposed on the transferred substrate 21. The GaN drift layer 23 is disposed on the metallic interlayer 22. Similar to the previous embodiment, the semiconductor device can be manufactured to a semiconductor layers group first and then transferred the semiconductor layers group to the transferred substrate 21. In the present disclosure, the semiconductor layers group include the GaN drift layer 23, the current blocking layer 241, the GaN buffer layer 242, the leakage current stop layer 25, the GaN channel layer 26 and the AlGaN barrier layer 27. The transferred process uses metallic interlayer 22 to combine the transferred substrate 21 with the GaN drift layer 23.

In the semiconductor layers group, the current blocking layer 241 is disposed on the GaN drift layer 23 and the current blocking layer 241 is formed by Mg ion implantation to a GaN layer. The GaN buffer layer 242 is disposed on an aperture area of the GaN layer. The leakage current stop layer 25 is disposed on the current blocking layer 241. The GaN channel layer 26 is disposed on the GaN buffer layer 242 and the leakage current stop layer 25. The AlGaN barrier layer 27 is disposed on the GaN channel layer 26.

The GaN layer is disposed on the GaN drift layer 23. This GaN layer may have two parts, one is the current blocking layer 241 and the other one is the GaN buffer layer 242. The GaN buffer layer 242 is the original GaN layer. The current blocking layer 241 is formed by Mg ion implantation to the GaN layer at the current leakage path location. The current blocking layer 241 may be formed by selective Mg ion implantation. The leakage current stop layer 25 is disposed on the current blocking layer 241. The leakage current stop layer 25 is also at the current leakage path location. The leakage current stop layer 25 may include AlN or $Ga_2O_3$. The leakage current stop layer 25 is the ultra-wide bandgap interlayer, for example, the AlN is 6.2 eV. Based on the leakage current stop layer 25 and the current blocking layer 241, the current leakage path from the source contacts 271 to the drain contact 211 can be blocked. The parasitic leakage current penetrating the current blocking layer 241 can be avoided, so as to form the high speed power current aperture vertical electron transistor (CAVET) with excellent reliability.

The channel layer is disposed on the GaN layer. The channel layer includes the GaN channel layer 26 and the AlGaN barrier layer 27. The GaN channel layer 26 is disposed on the GaN buffer layer 242 and the leakage current stop layer 25. The AlGaN barrier layer 27 is disposed on the GaN channel layer 26. Based on the heterostructure of the GaN layer and the AlGaN layer, the two dimensional electron gas 2DEG is occurred at the GaN channel layer. The carrier transport of the two dimensional electron gas 2DEG may generate a current flow for the semiconductor device 20.

The transferred substrate 21 has the drain contact 211 formed on a rear surface 212 of the transferred substrate 21. The drain contact 211 may be overlapped to the leakage current stop layer 15 and the current blocking layer 161. The AlGaN barrier layer 27 has source contacts 271 and gate contact 272. The source contacts 271 are disposed through the AlGaN barrier layer 27 for contacting the GaN channel layer 26 and the gate contact 272 is disposed on a top surface 273 of the AlGaN barrier layer 27. In the present embodiment, the drawing only shows the single gate contact structure and single drain contact structure. However, the present disclosure is not limited to the single contact structure. In other embodiment, the gate contact 272 and the drain contact 211 can be plural.

In the present embodiment, the GaN channel layer 26, the leakage current stop layer and the GaN buffer layer may be un-doped. The semiconductor device 20 does not need to consider the doping concentration problem in the manufacturing processes.

Please refer to FIG. 3A to FIG. 3H, which are the schematic diagrams of the manufacturing process of forming the semiconductor device in accordance with another embodiment of the present disclosure.

Figure 3A:
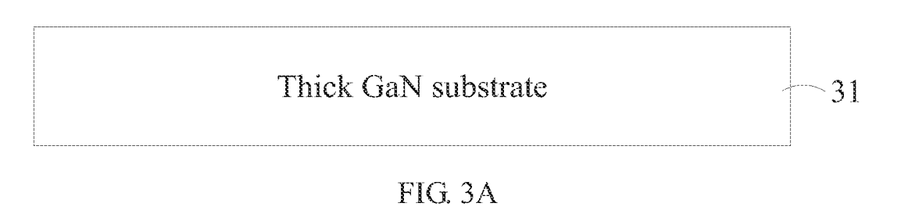
FIG. 3A to FIG. 3J are schematic diagrams of the manufacturing process of forming the semiconductor device in accordance with another embodiment of the present disclosure.

In FIG. 3A, the manufacturing process provides a thick GaN substrate 31. In the present embodiment, the first substrate may select the GaN substrate with predetermined thickness. The thickness is above 1 μm. The thick GaN substrate 31 may ensure that the lattice is neatly arranged and the surface of the thick GaN substrate layer 31 is the almost defect-free surface. The thick GaN substrate 31 may also prevent the defect caused by the substrate with the lattice mismatch with GaN less than 3.6%.

Figure 3B:
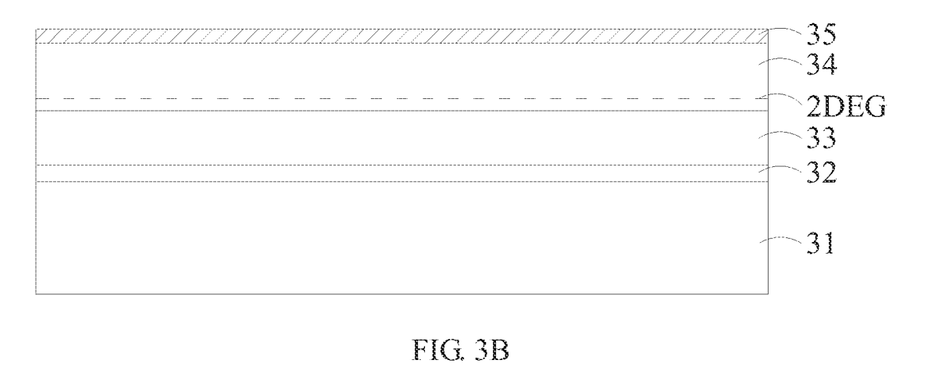

In FIG. 3B, the manufacturing process sequentially forms a nucleation layer 32, an AlGaN barrier layer 33, a GaN channel layer 34 and a leakage current stop layer 35 on the thick GaN substrate 31. The nucleation layer 32, the GaN channel layer 34 and the leakage current stop layer 35 are un-doped. Continue from the previous step, the several semiconductor layers are sequentially formed on the thick GaN substrate 31. Since the thick GaN substrate 31 is used, the nucleation layer 32 is formed on the GaN layer once.

The nucleation layer 32 is formed on the GaN substrate 31. The nucleation layer 32 may be an AlN layer or an AlN/AlGaN superlattice layer. If the nucleation layer 32 is the AlN/AlGaN superlattice layer, the AlN/AlGaN superlattice layer is composed of $Al_{(x)}Ga_{(1-x)}N$ and the mole fraction x of the $Al_{(x)}Ga_{(1-x)}N$ is above 0.6. For example, x may be 0.7 or 0.8. Based on the thick GaN substrate layer 31 and the nucleation layer 32, the lattice is neatly arranged. The active region formed on the above stacked layer may be the low defect active region.

After forming the low defect layer, the AlGaN barrier layer 33 and the GaN channel layer 34 are sequentially formed on the nucleation layer 32. The AlGaN barrier layer 33 is disposed on the nucleation layer 32 and the GaN channel layer 34 is disposed on the AlGaN barrier layer 33. The AlGaN barrier layer 33 and the GaN channel layer 34 may be the active region. The two dimensional electron gas 2DEG is occurred at the GaN channel layer 34 and the carrier transport of the two dimensional electron gas may generate a current flow for the semiconductor device.

When the semiconductor device drives to generate the current flow, some current leakage paths may be generated from source to drain. In order to prevent the current leakage, the blocking layer is used to block the leakage path. However, the conventional epi-growth method is not easy to form the block layer at predetermined area. The lattice stacked at the location of current flow may also be influenced. Therefore, the present disclosure forming the leakage current stop layer 35 on the GaN channel layer 34. The leakage current stop layer 35 may include AlN or $Ga_2O_3$. The leakage current stop layer 35 is the ultra-wide bandgap interlayer, for example, the AlN is 6.2 eV. The leakage current stop layer 35 is grown on the entire area of the channel structure, that is, the GaN channel layer 34. Compared to partial growth process, the present manufacture process may have higher process reliability and better product quality.

Figure 3C:
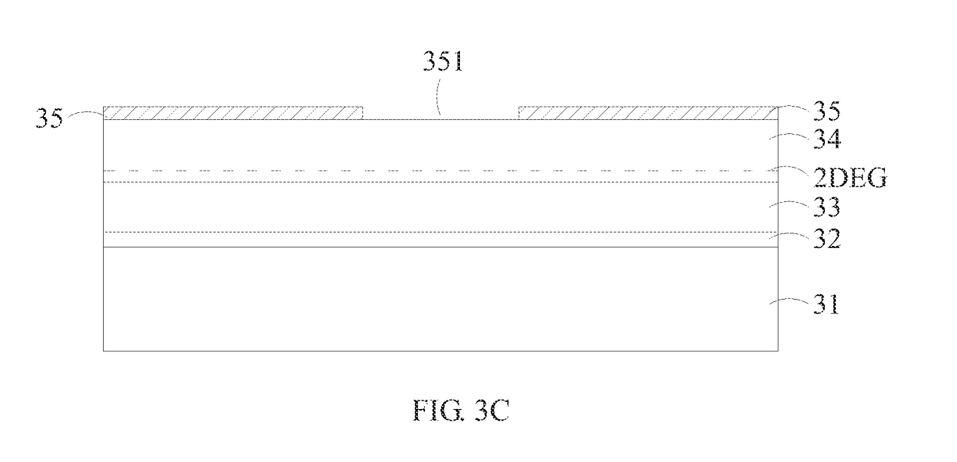

In FIG. 3C, the manufacturing process forms an aperture area 351 through the leakage current stop layer 35. The leakage current stop layer 35 is etched by a hard mask to form the aperture area 351. The aperture area 351 is corresponding to the gate area. The etching process may expose the top surface of the GaN channel layer 34.

Figure 3D:
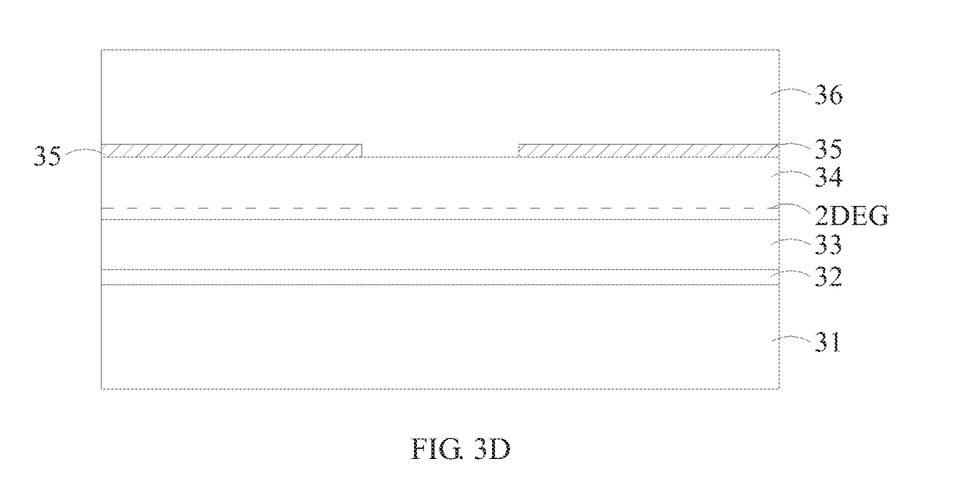

In FIG. 3D, the manufacturing process forms a GaN buffer layer 36 on the leakage current stop layer 35 and the aperture area 351. The GaN layer buffer layer 36 is growing from the GaN channel layer 34 and to fill up the aperture area 351. The GaN layer buffer layer 36 is further growing form the surface of the leakage current stop layer 35 and the aperture area 351.

Figure 3E:
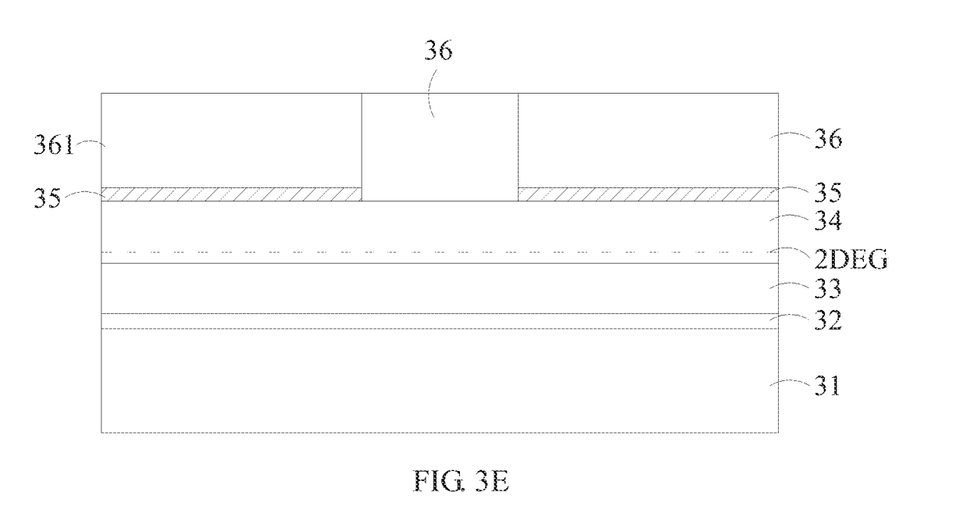

In FIG. 3E, the manufacturing process implants Mg ions to the GaN buffer layer 36 to form a current blocking layer 361 on the leakage current stop layer 35. The Mg ion implantation can be conducted on the GaN buffer layer 36. For example, the selective Mg ion implantation. Using the implantation process instead of the GaN buffer regrowth layer process may form the planar surface. The gate current leakage caused by the non-planar surface can be avoided.

Figure 3F:
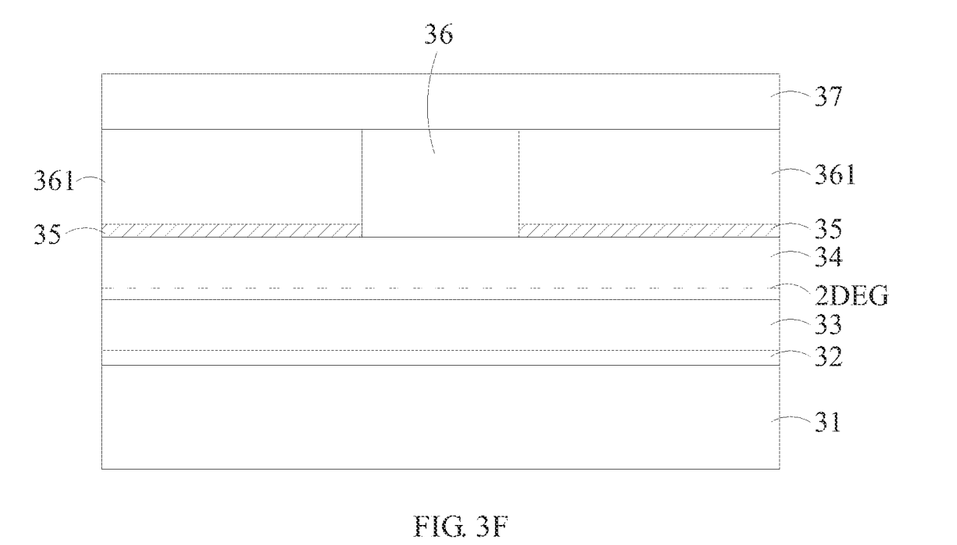

In FIG. 3F, the manufacturing process forms a GaN drift layer 37 on the current blocking layer 361 and the GaN buffer layer 36. In the previous process, the Mg ions are implanted in the GaN buffer layer 36. The surface of the GaN buffer layer 36 and the surface of the current blocking layer 361 are flat. The GaN buffer layer 36 is formed on the planar surface and the quality of the GaN growth will be better. The GaN growing process may be the metal organic chemical vapor phase deposition (MOCVD) process.

Figure 3G:
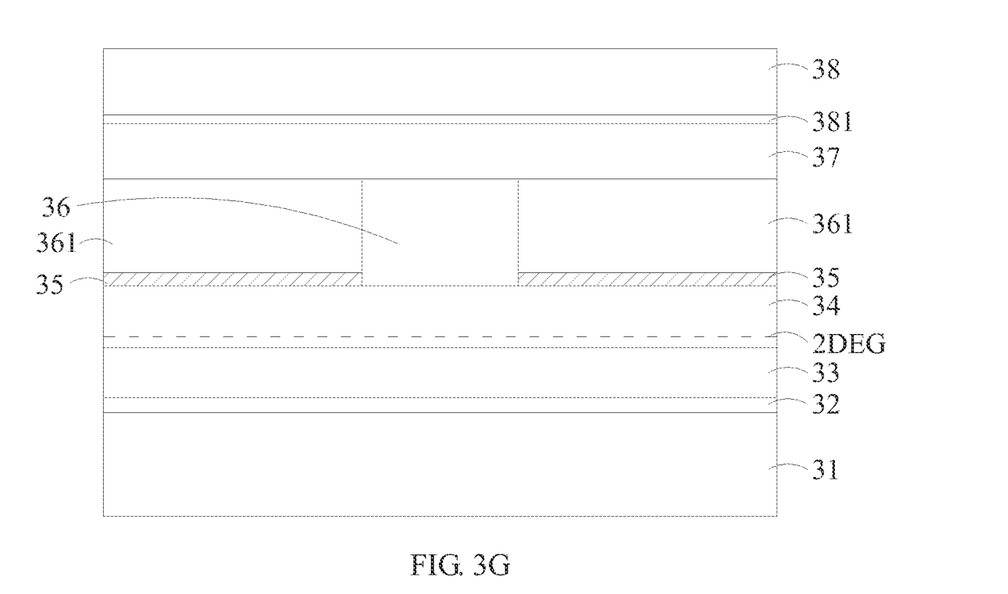

In FIG. 3G, the manufacturing process forms a metallic interlayer 381 on the GaN drift layer 37 and transferring the GaN drift layer 37 on a transferred substrate 38 through the metallic interlayer 381. In order to transfer the semiconductor device formed by the previous processes, the metallic interlayer 381 is formed on the GaN drift layer 37. At the same time, the transferred substrate 38 also has a metallic interlayer 381 disposed on the surface of the transferred substrate 38. The transferred substrate 18 may include Si, GaAs, $Al_2O_3$ or $Ga_2O_3$. The above material for forming the transferred substrate 38 is not easy to combine with the GaN drift layer 37. Therefore, the metallic interlayer 381 is used as the buffer layer for combining the transferred substrate 38 and the GaN drift layer 37.

Figure 3H:
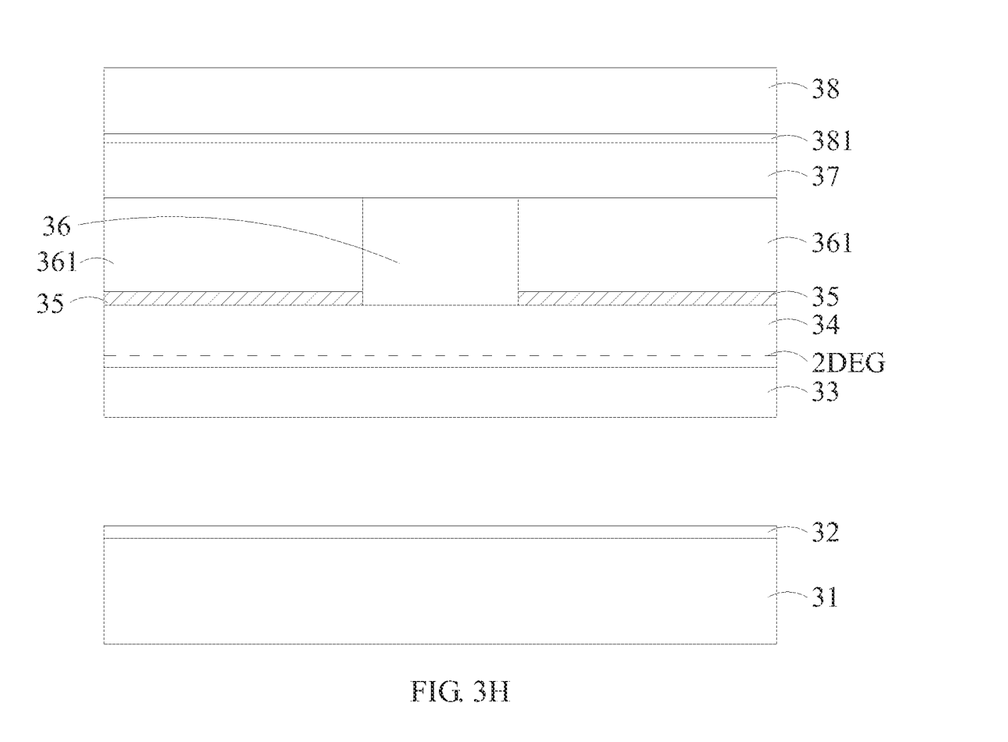

In FIG. 3H, the manufacturing process removes a semiconductor stack, the semiconductor stack includes the nucleation layer 32 and the thick GaN substrate layer 31. Since the transferred substrate 38 is disposed on the GaN drift layer 37, the transferred substrate 38 is regarded as the main substrate of the semiconductor device. In the present step, the semiconductor stacked is removed to expose the AlGaN barrier layer 33. The semiconductor stack may be removed by mechanical thinning, chemical etching, photoelectrochemical etching or laser lift-off.

The semiconductor stack includes the thick GaN substrate layer 31 and the nucleation layer 32. Since the semiconductor stack is removed, the thick GaN substrate layer 31 can be recycled and used at different manufacturing processes. The manufacturing cost can be reduced by saving the substrate material.

Figure 3I:
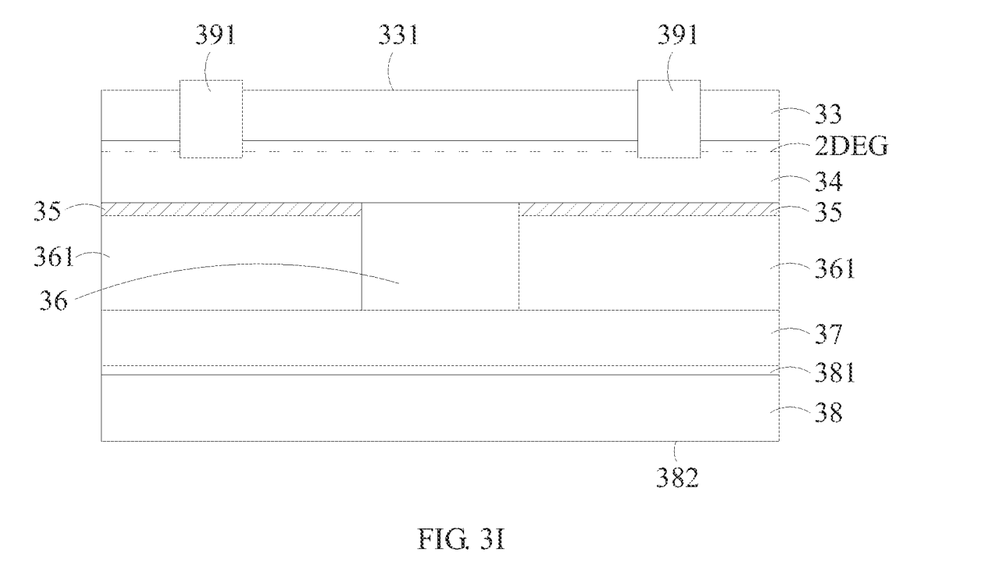

In FIG. 3I, the manufacturing process forms source contacts 391 through the AlGaN barrier layer 33, the source contacts 391 contact the GaN channel layer 34. In the previous process, the semiconductor stack is removed. The remained semiconductor device can be flipped over. That is, the transferred substrate 38 is on the bottom and the AlGaN barrier layer 33 is on the top. The transferred substrate 38 has a rear surface 382 and the AlGaN barrier layer 33 has a tops surface 331. The AlGaN barrier layer 33 can be etched from the tops surface 331 to form the voids. The source contacts 391 are formed by filling up the voids with the conductive material, for example, the material can be copper. The source contacts 391 may pass through the AlGaN barrier layer 33 and contact the GaN channel layer 34. In some embodiments, the source contacts 391 may pass through the GaN channel layer 34 with predetermined depth.

Figure 3J:
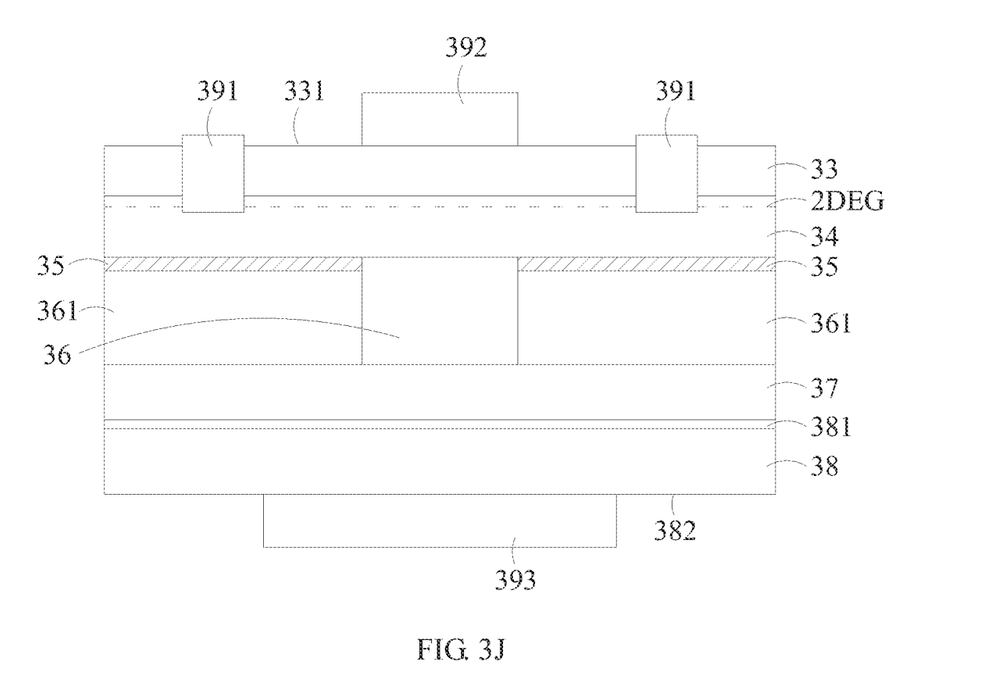

In FIG. 3J, the manufacturing process forms a gate contact 392 on the AlGaN barrier layer 33 and forms a drain contact 393 on the transferred substrate 38. After forming the source contacts 391, the gate contact 392 is formed on the top surface 331 of the AlGaN barrier layer 33 and the drain contact 393 is formed on the rear surface 382 of the transferred substrate 38. In the present embodiment, the drawing only shows the single gate contact structure and single drain contact structure. However, the present disclosure is not limited to the single contact structure. In other embodiment, the gate contact 392 and the drain contact 393 can be plural. The gate contact 392 is disposed at the location corresponding to the GaN buffer layer 361. The drain contact 393 may be overlapped to the leakage current stop layer 35 and the current blocking layer 361. Based on the leakage current stop layer 35 and the current blocking layer 361, the current leakage path from the source contacts 391 to the drain contact 393 can be blocked. The parasitic leakage current penetrating the current blocking layer 361 can be avoided, so as to form the high speed power current aperture vertical electron transistor (CAVET) with excellent reliability.

The present disclosure disclosed herein has been described by means of specific embodiments. However, numerous modifications, variations and enhancements can be made thereto without departing from the spirit and scope of the disclosure set forth in the claims.

What is claimed is:

1. A manufacturing method of forming a semiconductor device, the manufacturing method comprising:
   providing a native substrate, the native substrate having a lattice mismatch with GaN less than 3.6%;
   sequentially forming a first nucleation layer, a thick GaN substrate layer, a second nucleation layer, an AlGaN barrier layer, a GaN channel layer and a leakage current stop layer on the native substrate, the first nucleation layer, the thick GaN substrate layer, the second nucleation layer, the GaN channel layer and the leakage current stop layer being un-doped;
   forming an aperture area through the leakage current stop layer;
   forming a GaN buffer layer on the leakage current stop layer and the aperture area;
   implanting Mg ions to the GaN buffer layer to form a current blocking layer on the leakage current stop layer;
   forming a GaN drift layer on the current blocking layer and the GaN buffer layer;

forming a metallic interlayer on the GaN drift layer and transferring the GaN drift layer on a transferred substrate through the metallic interlayer;

removing a semiconductor stack, the semiconductor stack comprising the second nucleation layer, the thick GaN substrate layer, the first nucleation layer and the native substrate;

forming a source contact through the AlGaN barrier layer, the source contact contacting the GaN channel layer;

forming a gate contact on the AlGaN barrier layer;

forming a drain contact on the transferred substrate.

2. The manufacturing method of claim 1, wherein the native substrate comprises GaN, AlN or SiC.

3. The manufacturing method of claim 1, wherein the first nucleation layer comprises an AlN layer or an AlN/AlGaN superlattice layer.

4. The manufacturing method of claim 3, wherein the AlN/AlGaN superlattice layer is composed of $Al_{(x)}Ga_{(1-x)}N$ and mole fraction x of the $Al_{(x)}Ga_{(1-x)}N$ is above 0.6.

5. The manufacturing method of claim 1, wherein the thick GaN substrate layer has a thickness and the thickness is above 1 μm.

6. The manufacturing method of claim 1, wherein the second nucleation layer comprises an AlN layer or an AlN/AlGaN superlattice layer.

7. The manufacturing method of claim 6, wherein the AlN/AlGaN superlattice layer is composed of $Al_{(y)}Ga_{(1-y)}N$ and mole fraction y of the $Al_{(y)}Ga_{(1-y)}N$ is above 0.6.

8. The manufacturing method of claim 1, wherein the leakage current stop layer comprises AlN or $Ga_2O_3$.

9. The manufacturing method of claim 1, wherein the current blocking layer is formed by selective Mg ion implantation.

10. The manufacturing method of claim 1, wherein the semiconductor stack is removed by mechanical thinning, chemical etching, photoelectrochemical etching or laser lift-off.

11. The manufacturing method of claim 1, wherein the transferred substrate comprises Si, GaAs, $Al_2O_3$ or $Ga_2O_3$.

* * * * *